United States Patent
Lang et al.

(10) Patent No.: US 7,177,340 B2
(45) Date of Patent: Feb. 13, 2007

(54) EXTENDED CAVITY LASER DEVICE WITH BULK TRANSMISSION GRATING

(75) Inventors: Robert J. Lang, Alamo, CA (US); Robert G. Waarts, Los Altos, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 223 days.

(21) Appl. No.: 10/701,258

(22) Filed: Nov. 4, 2003

(65) Prior Publication Data

US 2004/0165639 A1    Aug. 26, 2004

Related U.S. Application Data

(60) Provisional application No. 60/423,740, filed on Nov. 5, 2002.

(51) Int. Cl.
*H01S 3/10* (2006.01)
*H01S 3/08* (2006.01)

(52) U.S. Cl. .......................... 372/102; 372/96; 372/22
(58) Field of Classification Search .............. 372/102, 372/96, 22
See application file for complete search history.

(56) References Cited

U.S. PATENT DOCUMENTS

| | | | | |
|---|---|---|---|---|
| 4,337,994 A * | 7/1982 | Brasier | ......................... | 359/18 |
| 5,384,797 A | 1/1995 | Welch et al. | .................. | 372/23 |
| 5,392,308 A | 2/1995 | Welch et al. | .................. | 372/92 |
| 5,448,398 A | 9/1995 | Asakura et al. | ............. | 359/328 |
| RE35,215 E | 4/1996 | Waarts et al. | ................ | 372/108 |
| 5,644,584 A | 7/1997 | Nam et al. | ..................... | 372/20 |
| 5,771,252 A | 6/1998 | Lang et al. | .................... | 372/20 |
| 5,867,512 A | 2/1999 | Sacher | ......................... | 372/20 |
| 5,956,355 A * | 9/1999 | Swanson et al. | .............. | 372/20 |
| 6,122,104 A * | 9/2000 | Nakai | ......................... | 359/576 |
| 6,215,809 B1 * | 4/2001 | Ziari et al. | .................... | 372/96 |
| H1965 H * | 6/2001 | Burns et al. | ................. | 372/22 |
| 6,370,168 B1 | 4/2002 | Spinelli | ....................... | 372/22 |
| 6,393,038 B1 | 5/2002 | Raymond et al. | ............ | 372/22 |
| 6,432,471 B1 * | 8/2002 | Cook | .......................... | 427/10 |
| 6,438,153 B1 | 8/2002 | Caprara et al. | ............... | 372/92 |
| 6,452,720 B1 * | 9/2002 | Naganuma et al. | .... | 359/341.31 |
| 6,600,563 B1 * | 7/2003 | Bahatt et al. | ............... | 356/445 |

(Continued)

OTHER PUBLICATIONS

"Diffraction grating" obtained from Wikapedia at http://www.wikapedia.com on Jun. 2, 2006.*

*Primary Examiner*—Minsun Harvey
*Assistant Examiner*—Marcia A. Golub
(74) *Attorney, Agent, or Firm*—Allen, Dyer, Doppelt, Milbrath & Gilchrist, P.A.

(57) ABSTRACT

A laser apparatus is disclosed utilizing a laser diode having a reflective back facet and a front facet having a reflectance of less than about 1% for emitting an optical beam at a fundamental frequency along an optical path. A collimating lens is provided for collimating the optical beam into a collimated beam. A transmission grating is optically coupled to receive the collimated beam and returns a portion of the collimated beam back into the laser diode by means of diffraction through lens and the laser diode front facet. The laser diode reflective back facet and the transmission grating form an extended laser cavity. In operation, a substantial portion of the collimated beam is transmitted through the transmission grating for producing the laser output beam propagating along the optical path.

26 Claims, 9 Drawing Sheets

U.S. PATENT DOCUMENTS

| | | |
|---|---|---|
| 6,614,584 B1 * | 9/2003 | Govorkov et al. .......... 359/328 |
| 6,704,509 B1 * | 3/2004 | Yang et al. .................... 398/34 |
| 6,816,516 B2 * | 11/2004 | Daiber ........................ 372/20 |
| 6,829,278 B1 * | 12/2004 | Allenson et al. ........... 372/50.1 |
| 6,885,687 B2 * | 4/2005 | Hayakawa ................... 372/21 |
| 2002/0012377 A1 * | 1/2002 | Suganuma et al. ........... 372/98 |
| 2003/0214700 A1 * | 11/2003 | Sidorin et al. .............. 359/334 |

* cited by examiner

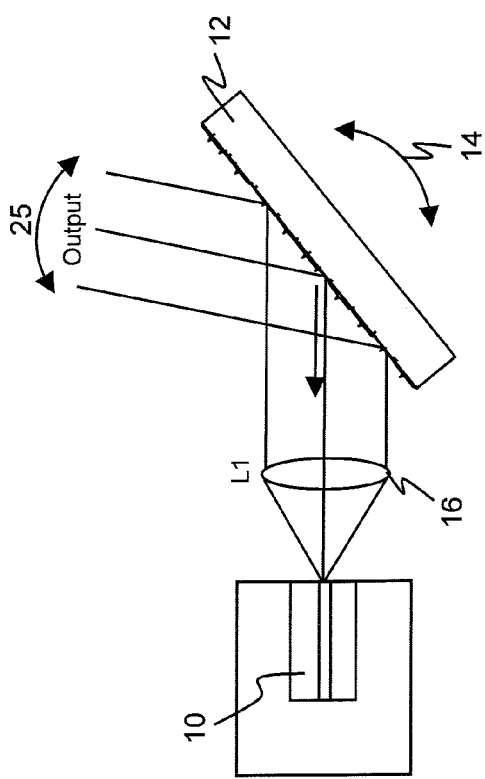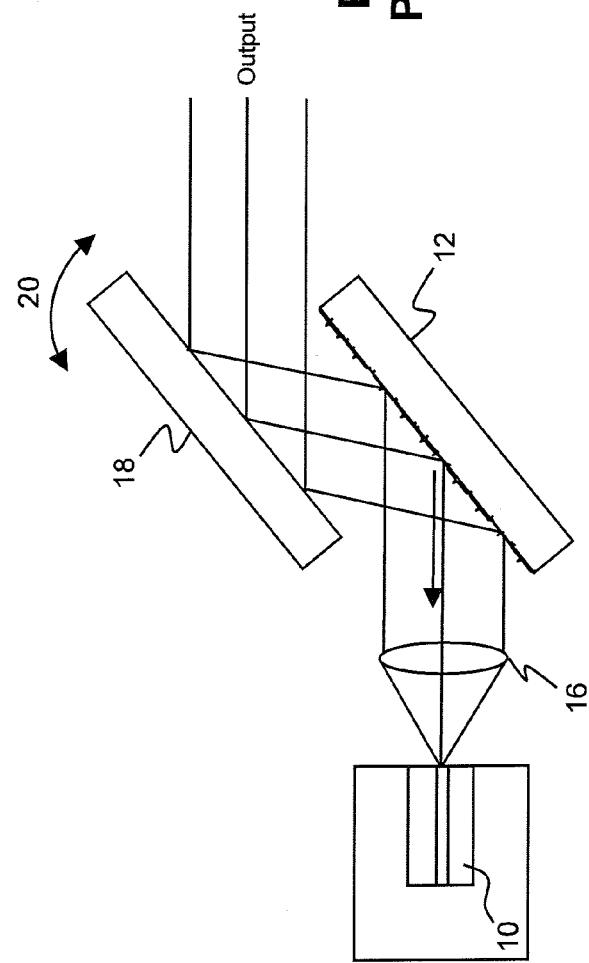

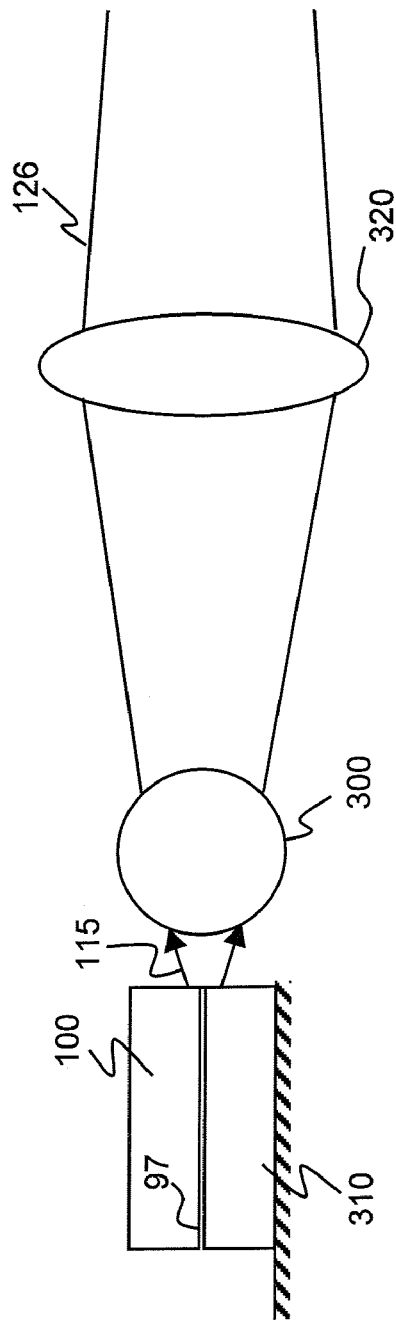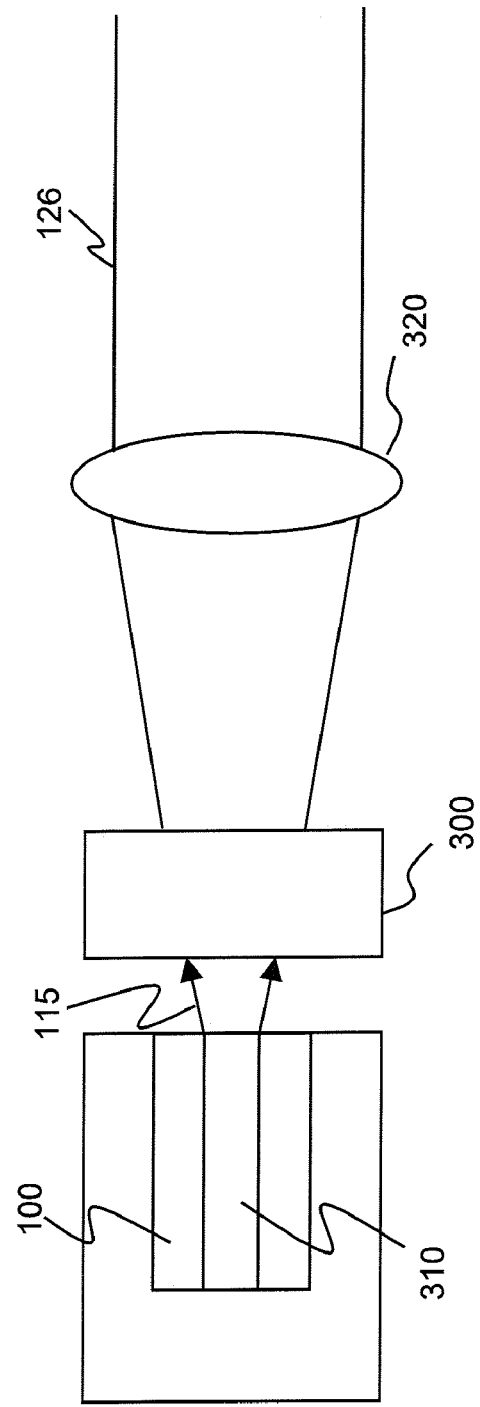

EXTENDED CAVITY LASER DEVICE WITH BULK TRANSMISSION GRATING

CROSS-REFERENCE TO RELATED APPLICATIONS

This application claims priority of U.S. Provisional Patent Application No. 60/423,740 filed Nov. 5, 2002, entitled "Blue Frequency-Doubled Diode Laser Configuration" which is incorporated herein by reference for all purposes.

FIELD OF THE INVENTION

The present invention relates to sources of laser radiation and their optical stabilization. This invention is particularly suitable for sources of short-wavelength radiation employing frequency doubling of laser diode emission in external cavity configurations.

BACKGROUND OF THE INVENTION

There is considerable demand for short-wavelength laser sources such as green, blue and UV lasers. One known approach to create such a light source is to utilize red or infra-red laser diodes, which are widely available in a variety of configurations. These diodes, in combination with nonlinear elements made of optically nonlinear materials, can produce short-wavelength frequency-doubled radiation by means of second harmonic generation (SHG) in the nonlinear element.

A laser source for frequency doubling requires (a) high power, (b) stable, narrow-line operation, (c) some a means of fine-tuning the spectrum to match it to a doubling material, and, importantly (d) simple, low-cost optics and assembly.

A number of prior art designs for frequency doubling of laser diode emission have been disclosed. For example, U.S. Pat. No. 5,384,797, in the names of Welch et al., describes a monolithic multi-wavelength laser diode array having output light that can be coupled into a ferroelectric frequency doubler integrally formed on an array substrate. U.S. Pat. No. 5,644,584, in the names of Nam et al. describes a tunable blue laser diode having a distributed Bragg reflector (DBR) or distributed feedback (DFB) tunable diode laser coupled to a quasi-phase-matched waveguide of optically nonlinear material. U.S. Pat. No. 6,370,168 to Spinelli describes an intracavity frequency-converted optically-pumped semiconductor laser based on surface-emitting gain-structure surmounting a Bragg mirror, and an external concaved mirror. U.S. Pat. No. 6,393,038 to Raymond et al. describes a frequency-doubled vertical-external-cavity surface-emitting laser; and, U.S. Pat. No. 6,438,153 to Caprara et al. describes an intracavity-converted optically-pumped semiconductor laser.

Although these aforementioned inventions appear to perform their intended function, they provide solutions wherein power and frequency stabilization requirements are met through the use of complex laser structures or complex nonlinear element arrangements. Furthermore, since complex laser designs usually lead to somewhat reduced power, these prior art solutions either use an intra-cavity nonlinear doubling arrangement to benefit from the intra-cavity resonance power enhancement, at the expense of yet more complex cavity control, or use single-pass doubling with relatively low output powers An alternative approach is to use semi-conductor, high power, lasers of simple cavity design, such as edge emitting 980 nm laser diodes commonly used to pump erbium-doped fiber amplifiers, in an external cavity arrangement with frequency stabilization provided by an external frequency selective reflector. Lasers of this type are commercially available and typically use a substantially broadband fiber Bragg grating (FBG) as the frequency selective reflector. These single spatial mode semiconductor chips have an antireflection coated front facet, and can generate over 1 watt of power in continuous operation, provided that optical feedback from the FBG into the laser diode is optimized, typically at a feedback level when about 3% of the laser radiation is returned back into the laser diode.

However, the substantially broadband reflection spectrum of the FBG results in a broad laser linewidth of the order of 0.3–1 nm. This linewidth far exceeds typical linewidth requirements of ~0.02–0.1 nm or less for efficient SHG in such materials as periodically-poled $LiNbO_3$, thus necessitating the use of other external frequency selective elements, such as bulk diffraction gratings.

As an additional advantage over FBGs, a bulk grating arrangement avoids the optical loss associated with coupling of a laser diode beam into an FBG, therefore significantly increasing the output optical power available for nonlinear frequency conversion.

An external diffraction grating is most commonly used in either Littrow configuration, wherein the grating is oriented to retro-reflect a portion of laser radiation back into the laser diode, or in a Littman configuration, wherein a retro-reflected beam is formed by a portion of the laser beam after reflecting twice from the grating and once from a mirror. Several implementations of these configurations have been disclosed in U.S. Pat. No. 5,392,308 to Welch et al., U.S. Pat. No. 5,771,252 to Lang et al. and in U.S. Pat. No. 5,867,512 to Sacher.

FIG. 1A illustrates a conventional Littrow configuration. In this configuration, a laser diode 10 is combined with a rotatable reflective grating 12, as indicated by arrow 14, via appropriate optics 16 to provide frequency selection feedback for laser diode 10. Tuning of the optical frequency in this configuration is achieved by rotation of the reflective grating 12.

In U.S. Pat. No. 5,448,398, Asakura, et al. disclose an intra-cavity nonlinear frequency doubling in a Littrow cavity with a reflective diffraction grating that incorporates a selective filter to provide noise reduction.

However, the low optimal feedback requirements of ~3% required for high-power lasers make the intra-cavity placement of the nonlinear SHG element an unnecessary complication. An outside-the-cavity arrangement becomes more practicable, wherein a nonlinear element is disposed in the path of an optical beam generated by the external cavity laser.

The drawback of a conventional Littrow cavity design described above for an outer-cavity arrangement of the nonlinear element is that the rotation of the reflective grating also leads to angular sweeping of the output beam 22 as indicated by the arrow 25 at twice the rate of grating rotation. When the cavity is followed by an angular selective element such as nonlinear frequency-doubling crystal, this angular tuning of the output beam can yield a drop in SHG efficiency and an undesirable steering of the beam.

This deficiency of the conventional reflective grating based Littrow configuration had been overcome in a now, more common Littman type configuration, illustrated in FIG. 1B. In this configuration, laser diode 10 is combined to form a "folded" external optical cavity with a fixed reflective element grating 12 and a rotatable reflective element 18, as indicated by arrow 20, to provide frequency selection feedback for laser diode 10. The output zero-order beam 22 is reflected off the fixed grating and does not change direction during tuning. The first order beam 13 incident upon the mirror and is reflected back to the grating, which diffracts it further back into the laser diode thereby providing frequency-selective feedback. Therefore in the Littman-type arrangement, the retro-reflected beam experiences two first-order diffractions off the grating, as opposed to a single diffraction in the case of Littrow arrangement. In US patent No. RE35,215, Waarts et al. describe a semiconductor laser light source which employs a Littman grating coupled to a back facet, providing short wavelength light by means of frequency doubling of red or infrared light from a high power flared resonator type laser diode, or a MOPA (master oscillator power amplifier) type laser diode.

The Littman arrangement however is known to have higher optical loss resulting from the double diffraction of the retro-reflected light. This higher loss can be a significant drawback for frequency doubling, since the SHG efficiency is proportional to optical power squared, and the frequency-doubled intensity suffers disproportionably when optical power is decreased. Indeed, if a 3% feedback is required from the grating-mirror arrangement for optimal operation of the laser diode, the first order diffraction efficiency is required to be $\sqrt{3\%}=17.3\%$, resulting in the zeroth-order output beam at only 83% of the facet power not including any other optical losses. In frequency-doubling, output efficiency is proportional to power squared and 17% loss of optical power reaching the SHG element results in a 32% reduction in frequency-doubled light intensity.

This invention provides a Littrow-type extended cavity arrangement obviating many of the aforementioned limitations of the prior art solutions, while providing for the aforementioned desirable attributes of a frequency-doubled laser; more particularly, high power, stable, narrow-line operation, a means of fine-tuning the spectrum to match it to a doubling material, and simple, low-cost optics and assembly.

An object of this invention is to provide a simple Littrow-type external cavity configuration for a diode laser, which substantially maximizes output power and enables frequency tuning without angular tuning of the output beam.

Another object of this invention is to provide an external cavity laser diode arrangement for generation of short-wavelength radiation through frequency doubling, which combines high power, frequency stabilization and tuning capabilities using simple, low cost optics and assembly.

SUMMARY OF THE INVENTION

In accordance with the invention, a Littrow-stabilized laser apparatus is provided comprising a laser diode having a reflective back facet and a front facet having a reflectance of less than 1% for emitting an optical beam at a fundamental frequency along an optical path, collimating means for at least partially collimating the optical beam into an at least partially collimated beam along the optical path, a transmission grating in a Littrow-type arrangement optically coupled to receive the at least partially collimated beam and for returning a portion of the at least partially collimated beam back into the laser diode by means of diffraction through the collimating means and the laser diode front facet, wherein the laser diode reflective back facet and the transmission grating form an extended laser cavity, and wherein in operation, at least a substantial portion of the at least partially collimated beam is transmitted through the transmission grating for producing the laser output beam propagating along the optical path, with a direction of the laser output beam being substantially angle insensitive to the transmission grating orientation.

In accordance with another aspect of the invention, while in operation, the transmission grating provides less than 10% optical power feedback into the laser diode, whilst transmits through itself more than 90% of the optical power of the at least partially collimated beam.

In accordance with another aspect of the invention, a laser apparatus for producing a frequency-doubled laser radiation is provided, comprising a Littrow-stabilized laser apparatus having at least the laser diode, a collimating means, and a transmission grating, for producing an output laser beam at the fundamental frequency. In a preferred embodiment the laser apparatus includes a nonlinear element such as periodically poled LiNbO$_3$ crystal or waveguide, optically aligned with the Littrow-stabilized laser apparatus to receive the output laser beam at the fundamental frequency, for producing a frequency-doubled output beam in the short-wavelength range of the visible optical spectrum or in the UV range by means of second harmonic generation in the nonlinear element.

BRIEF DESCRIPTION OF THE DRAWINGS

Exemplary embodiments of the invention will now be described in conjunction with the drawings in which:

FIG. 1A is a diagram of a prior art Littrow-stabilized laser diode.

FIG. 1B is a diagram of a prior art Littman-stabilized laser diode.

FIGS. 3a and 3b are a side and top plan views, respectively, of an exemplary astigmatism-correcting and collimating lens system which is useful in the present invention.

DETAILED DESCRIPTION OF THE INVENTION

Figure 2:
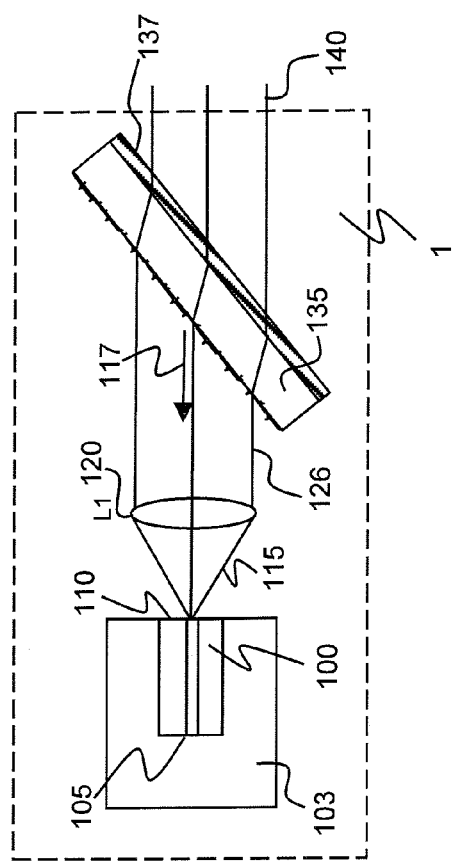
FIG. 2 is a diagram of a Littrow-stabilized laser diode using a transmission grating in accordance with the present invention.

A preferred embodiment of a Littrow-stabilized laser diode using a transmission grating is shown in FIG. 2 and is hereafter described.

A semiconductor laser diode chip 100 mounted on a carrier 103 has a high-reflection coated back facet 105 and an anti-reflection coated front facet 110. The laser diode is capable of emitting a high power coherent light beam 115 in a single spatial mode having a wavelength in the red or near-infrared region of the optical spectrum. The laser diode is optically coupled through a collimating means 120 to a bulk diffraction grating 135. The collimating means 120 at least partially collimates the light beam 115 to form a beam 126 hereinafter referred to as the at least partially collimated laser diode beam 126, or simply as the laser diode beam 126. The bulk diffraction grating 135 is oriented to diffract a portion of the laser diode beam 126 back into the laser diode to provide optical feedback, as schematically shown by an arrow 117. The collimating means 120 is shown to be a single lens but alternatively can be a collimating lens or more typically a system of collimating lenses. According to the invention the grating 135 is a transmission grating. A portion of the laser diode beam 126 passes through the transmission grating 135 forming an output laser beam 140.

The reflective back facet 105 of the laser chip 100 and the transmission grating 135 together form an extended laser diode cavity, providing frequency stabilization and frequency tuning capability. The extended cavity arrangement of the present invention enables single-mode radiation at a fundamental optical frequency which is determined by the orientation of the grating. By changing angular orientation of the grating the fundamental optical frequency can be tuned within a spectral range of the optical gain of the laser diode.

An important advantage of the invention with respect to the standard Littrow configuration is angular independence of the output laser beam 140 on the orientation of the grating 135, which is ensured by the use of the transmission grating 135 instead of a reflection grating. This property of the extended cavity arrangement of the present invention enables those skilled in the art to tune the fundamental frequency without changing direction of the output laser beam 140. A small vertical displacement of the beam 140 occurs when orientation of the grating 135 is changed; this displacement is however insignificant for the purposes of this invention.

In a preferred embodiment, the transmission grating 135 is oriented at a sharp angle with the optical path to provide maximum frequency selectivity for single-frequency lasing. It is preferable that the grating pitch be close to half of the laser diode wavelength so that the first-order beam is retro-reflected back into the laser diode, and to ensure that there exist no diffracted beams of diffraction order higher than the $1^{st}$ order, thereby minimizing optical losses.

Figure 4A:
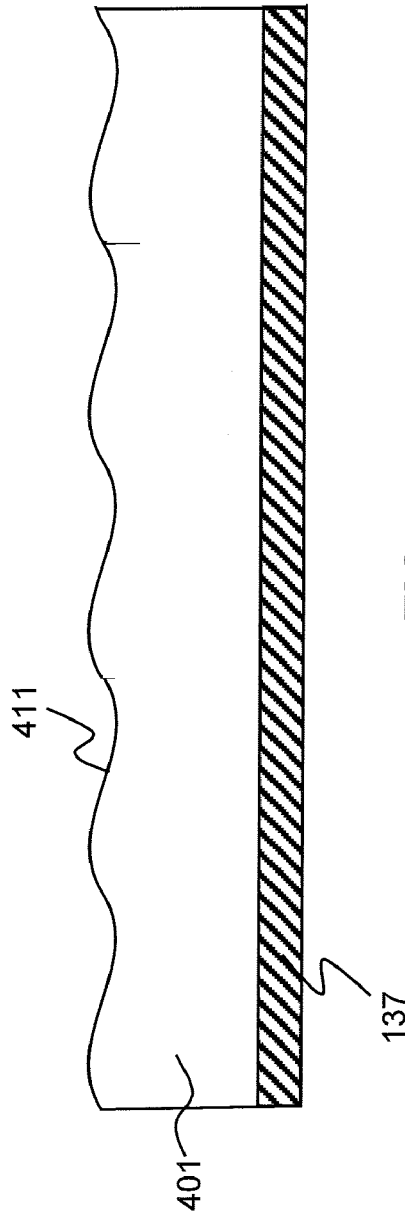
FIGS. 4a and 4b respectively provide a schematic of a surface-relief dispersion grating and a holographic dispersion grating.
Figure 4B:
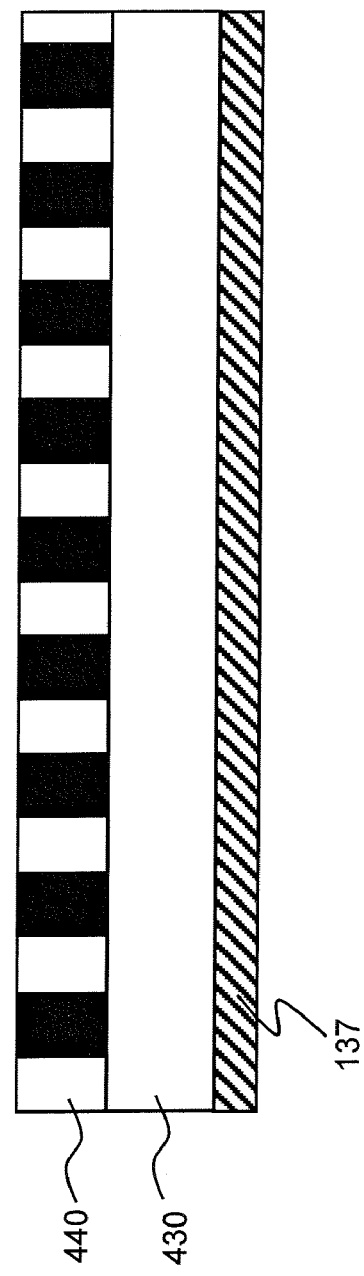

With reference to FIGS. 4a and 4b, the transmission grating 135 can be either a surface relief grating having a periodically corrugated surface 411 etched or drawn in a transparent material 401 such as glass, or a holographic grating optically written in a photo-sensitive material 440 supported by a substrate 430. In both cases, to suppress specular reflections from the back surface of the gratings, an anti-reflection coating 137 can be applied to the back surface. An antireflection coating can also be applied to the front surface of a holographic grating.

Diffraction efficiency of the transmission grating 135 can be sensitive to polarization orientation of an incident light beam. To decrease optical loss in the extended cavity and therefore increase optical power of the output laser beam 140, additional means can be used to align polarization direction of the laser diode beam 115 with along a polarization direction of the maximum diffraction efficiency of the transmission grating 135.

Figure 2A:
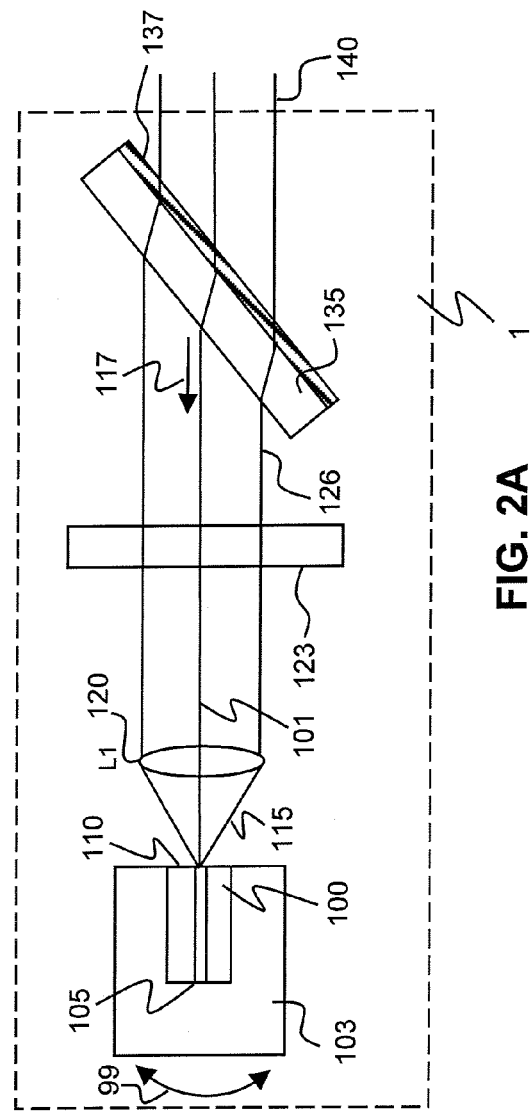
FIG. 2a is a diagram similar to FIG. 2 including a polarization controller for alignment of the laser diode output light polarization to efficiently couple with the grating.

With reference to FIG. 2a, a polarization controller 123 is disposed between the collimating means 120 and the transmission grating 135, for aligning the polarization direction of the laser diode beam 126 transmitted through the polarization controller along the preferred polarization direction of the grating 135. In one embodiment of the present invention, a linear polarizer aligned along the preferred polarization direction of the transmission grating 135 can be used as said polarization controller.

In another embodiment, said alignment can be achieved by rotating the laser diode carrier 103 about an optical axis 101 of the laser diode 101 of the laser diode as shown schematically in FIG. 2a by a curved double-sided arrow 99.

According to the present invention, the transmission-grating based Littrow-stabilized laser diode can incorporate a means for changing the orientation of the transmission grating for providing frequency tuning capability.

Figure 5:
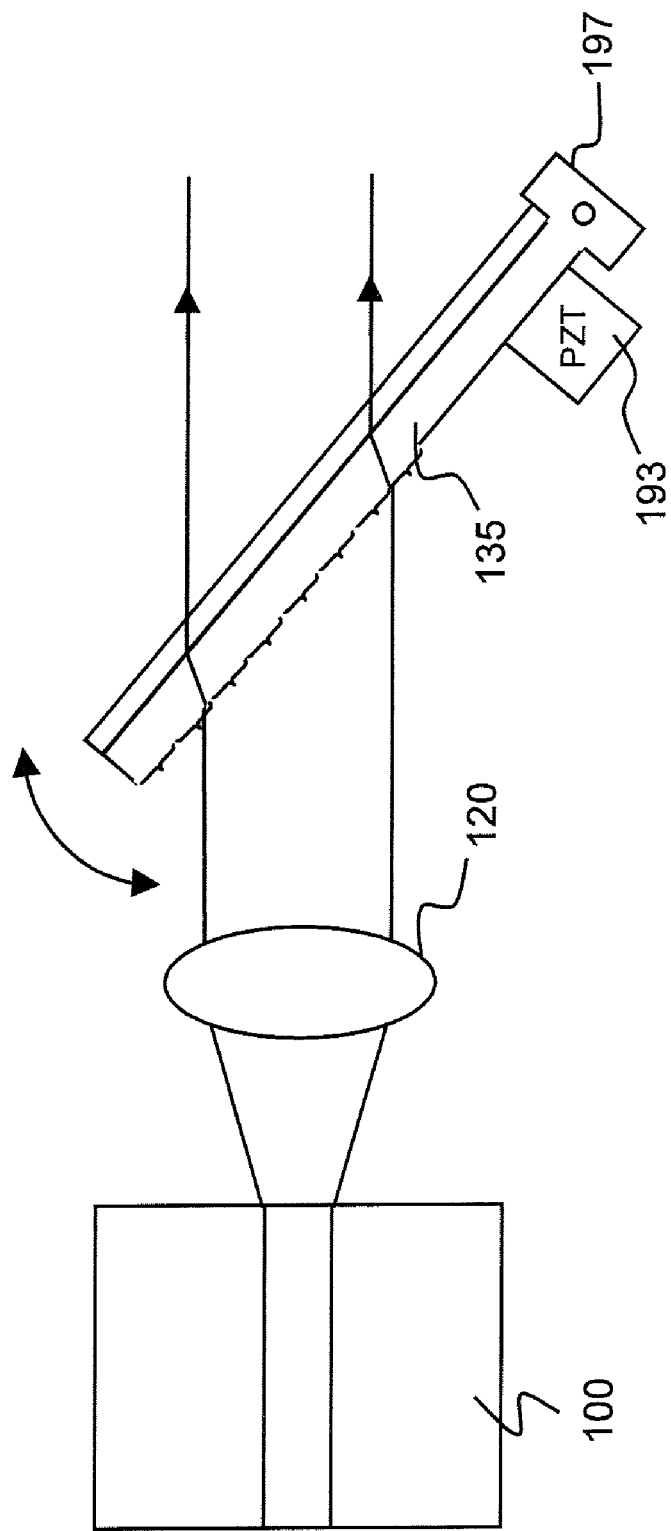
FIG. 5 is a schematic diagram of an exemplary implementation of a grating tuning means.

With reference to FIG. 5, such means can include for example a piezo-electric actuator 193 capable of rotating the transmission grating 135 about a pivotal axis 197 in response to an electrical control signal.

According to another embodiment of the present invention, orientation of the transmission grating may only be adjusted at an assembly stage around a pre-determined position to achieve lasing at a target wavelength, and then kept essentially fixed during the lifetime of the device. In this instance, a built-in tuning means may not be required.

The collimating means 120 can be a collimating lens or a system of collimating lenses, and can include an anamorphic lens or a system of lenses with anamorphic properties. An anamorphic lens such as a cylindrical lens is typically required when a semiconductor laser diode produces an asymmetric and astigmatic laser beam due to asymmetry of the lateral and transverse directions of a laser diode waveguide. The laser diode beam can be made symmetrical and its astigmatism can be significantly reduced when a cylindrical lens or more generally an anamorphic lens is disposed close to the laser facet 110.

With reference to FIGS. 3a and 3b, a preferred astigmatism-correcting and collimating lens system for use with a high-power type laser chip 100 includes a cylindrical lens 300 together with a collimation lens 320. The light beam 115 from the laser diode 100 is partially collimated by the cylindrical lens 300 in the transverse direction perpendicular to the plane of the active region 97 of the laser diode 100 so that it has substantially the same beam divergence in the transverse direction as it has in the lateral direction parallel to the plane of the active region 97. By placing the cylindrical lens 300 at the position where the transverse size dimension of the light beam 115 has expanded to equal the lateral size dimension of the beam 115 and by picking the focal length of the cylindrical lens 300 to achieve the aforementioned partial collimation, the laser diode beam 126 outputted from the lens 320 is made symmetric and free of astigmatism.

Another aspect of the present invention provides a frequency-converted laser apparatus comprising the Littrow-stabilized laser diode 1 of the first aspect of the present invention optically coupled to an out-of-cavity nonlinear element to produce frequency-converted coherent radiation from the laser output beam 140 of the Littrow-stabilized laser diode 1. According to this aspect of the invention, the laser output beam 140 is preferably a high-power beam as described hereinafter, and will also be referred to herein as the high-power beam 140 in the context of the frequency conversion.

In the preferred embodiment of this aspect of the present invention, the aforementioned frequency conversion is frequency doubling by means of SHG in the nonlinear element.

Figure 6:
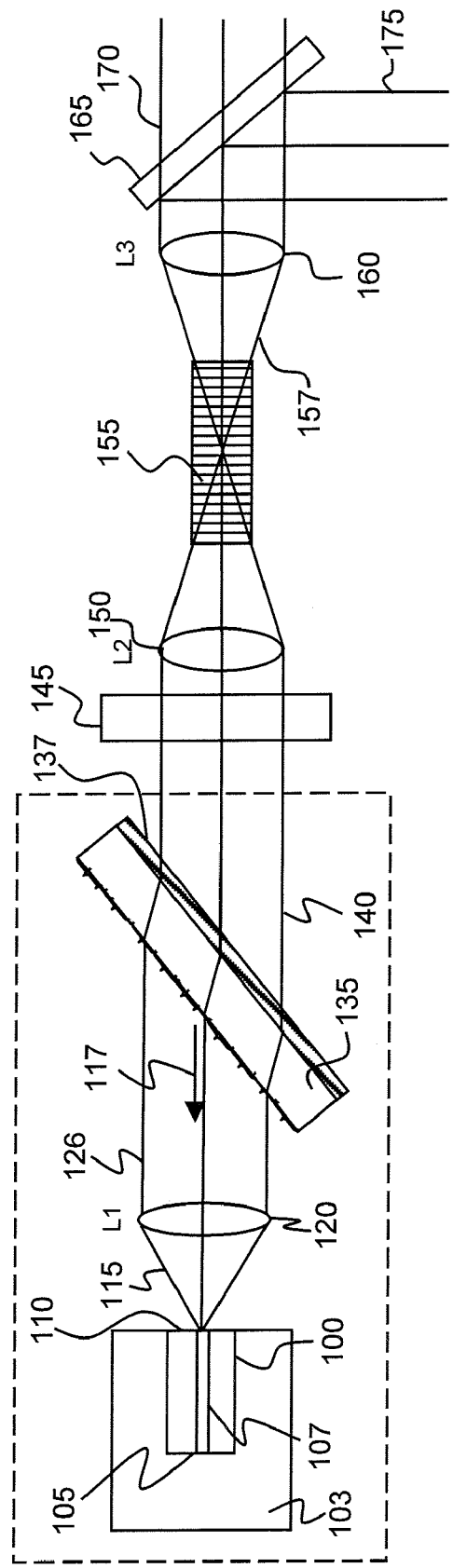
FIG. 6 is a diagram of a frequency-doubled laser apparatus according to the present invention.

With reference to FIG. 6, the Littrow-stabilized laser diode 1 comprising the laser diode chip 100, the collimating means 120, and the transmission grating 135, produces the at least partially collimated high-power beam 140 having substantially circular symmetry in a plane perpendicular to the direction of propagation. A nonlinear element 155 is positioned to receive the high power beam 140 from the Littrow-stabilized laser diode 1. The nonlinear element 155 is capable of generating a second light beam 157 having a wavelength in the ultraviolet, blue or green range of the spectrum from a portion of the optical power of the high-power beam 140. The second beam 157 has a wavelength which is different from that of the high-power beam 140. A dichroic filter 165 may be placed at the output of nonlinear element 155 to block the high-power beam, e.g. by reflecting it as an infrared dump beam 175 away from the optical path, and to pass the frequency-converted second beam as the output 170 of the laser apparatus. Additional collimating or collimating and focusing means 150 and 160 can be disposed between the Littrow-stabilized laser diode 1 and the nonlinear element 155, and between the nonlinear element 155 and the dichroic filter 165, respectively, for collimating or collimating and focusing the high power beam 140 and the second beam 157.

An optical isolation means 145 can be disposed between the Littrow-stabilized laser diode 1 and the nonlinear element 155 to pass the high-power beam 140 and to block a back-reflected portion of the high-power beam 140 from returning back into the laser diode chip 100 through the transmission grating 135. The back reflected portion of the high-power beam 140 can be for example due to reflections from the collimating means 150 and from the nonlinear element 155. The optical isolation means 145 can be a commercially available optical isolator.

A Littrow-stabilized laser diode can operate in a single-frequency or a multi-frequency regime. A single frequency operation is preferred because it provides for lower noise of the frequency-doubled radiation. If the laser operates in multi-longitudinal mode regime, distribution of optical power between different modes can vary in time, even when the total power of the laser radiation is substantially constant, thereby yielding increased spectral noise of the laser. Since the different modes may have different frequency conversion efficiency in the nonlinear element, variations of power distribution between the modes may cause variations of the total frequency-doubled output power.

In the preferred configuration the laser cavity is formed by the back facet 105 of the laser diode and the grating 135, and the reflection from the AR coated front facet 110 can be ignored. Therefore the spacing between the longitudinal modes is proportional to the length of the extended cavity. Single mode operation depends on the discrimination of the grating at different wavelengths and depends upon the mode spacing. For a certain grating resolution it is preferred to keep the cavity length as short as physically possible as this will increase mode spacing and therefore increase mode discrimination by the grating. It should be noted that using smaller lenses to keep the extended cavity shorter reduces the beam size and as a result decreases the spectral discrimination of the grating feedback. Therefore, although making the optics smaller results in shorter cavity and wider mode spacing, it may not improve single mode operation substantially.

In another configuration, a longer cavity with multi-mode operation or a coupled cavity with partial reflection coating of the front facet 110 of the laser diode may be acceptable providing that the frequency band of the laser light substantially overlaps with a wavelength band of efficient frequency doubling in the nonlinear element. In this case the spectral noise of the laser diode radiation associated with the multi-mode operation or mode instability due to reflections from the front facet can increase power fluctuations of the frequency-doubled output radiation. The spectral noise of the laser diode radiation however may be mitigated by providing an additional electric dither current to the laser diode to cause frequency modulation of the laser diode radiation with amplitude exceeding mode spacing. Such dithering will result in a continuous scrambling of the laser light to increase stability of time-averaged spectrum of the laser diode radiation and therefore to stabilize a time-averaged power of the frequency-doubled radiation.

The configuration shown in FIG. 6 is a single pass second harmonic generation or frequency-doubling configuration in which the nonlinear element is a bulk crystal of nonlinear optical material. The spot size of the beam 155 in the crystal is optimized for maximum single pass conversion efficiency by focusing the beam to the smallest possible spot size such that the beam still remains focused over the length of the crystal. In the case of a potassium niobate bulk crystal with a length of 1 cm and a 1 Watt infrared input power of the high-power beam 140 from the Littrow-stabilized laser diode 1, the output power of the blue frequency doubled beam 170 is about 10–20 mW. Using longer crystals the second harmonic generated output can be increased since the conversion efficiency increases linearly with the crystal length. In this single pass configuration the high power beam 140 is focused in the nonlinear crystal 155.

Alternatively, the nonlinear element can be a nonlinear waveguide produced for example by doping of a nonlinear crystalline material as known to those skilled in the art. In other embodiment, the nonlinear element can be a periodically-poled nonlinear crystalline material such as periodically-poled $LiNbO_3$, or periodically-poled $LiNbO_3$ waveguide The nonlinear crystalline material may also be potassium titanophosphate ($KTiOPO_4$), potassium niobate ($KNbO_3$), barium metaborate ($BaB_2O_4$), lithium triborate ($LiB_3O_5$), neodymium yttrium aluminum borate ($Nd_xY_{1-x}Al_3(BO_3)_4$, as well as various organic nonlinear optical materials.

Figure 7:
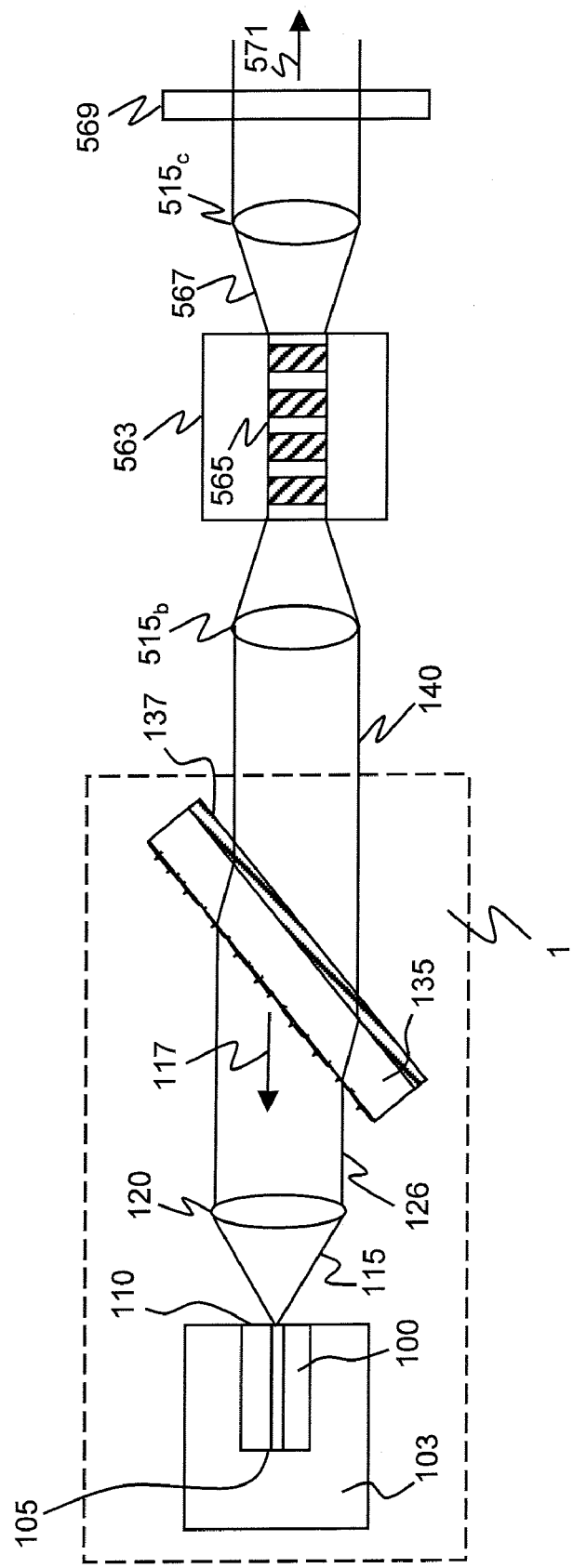
FIG. 7 is a diagram of a frequency-double laser apparatus incorporating a single-mode nonlinear waveguide according to the present invention.

With reference to FIG. 7, nonlinear second harmonic generating waveguides 565 is used with the Littrow-stabilized laser diode 1 of the present invention. The high power beam 140 emitted from the laser diode 11 is focused by a lens system 515b, typically a single spherical lens, to a small spot on the entrance to the narrow single mode waveguide 565 in the nonlinear crystal 563. Because of the narrow waveguide 565, typically about 3 mu.m wide, the light remains focused with a small width over the full interaction length of the crystal 563. The nonlinear single mode waveguide 565 preferably is a regularly segmented waveguide formed by ion exchange through a mask, using a molten salt bath or proton implantation to introduce the ions to be substituted in the crystal lattice. Periodic ferroelectric polarization domain reversals are preferred for optimum conversion efficiency. Assuming a typical optical conversion efficiency of 100%-$W/cm^2$ for second harmonic generation and neglecting pump depletion effects, a phase-matched or quasi-phase-matched crystal length of 1 cm and a 1 W input power for the beam 140 from the Littrow-stabilized laser diode 1 will provide nearly complete conversion of the fundamental input wavelength to the frequency doubled wavelength. The output 567 from the waveguide 565 is collected and collimated by lens elements 515*c*, typically a single spherical lens. A dichroic filter 569 may be placed in the path of the output beam 567 from the waveguide 565 to block any red or near-infrared light from input beam 140 that still remains unconverted and to pass only the frequency doubled light 571 as the output.

Figure 8:
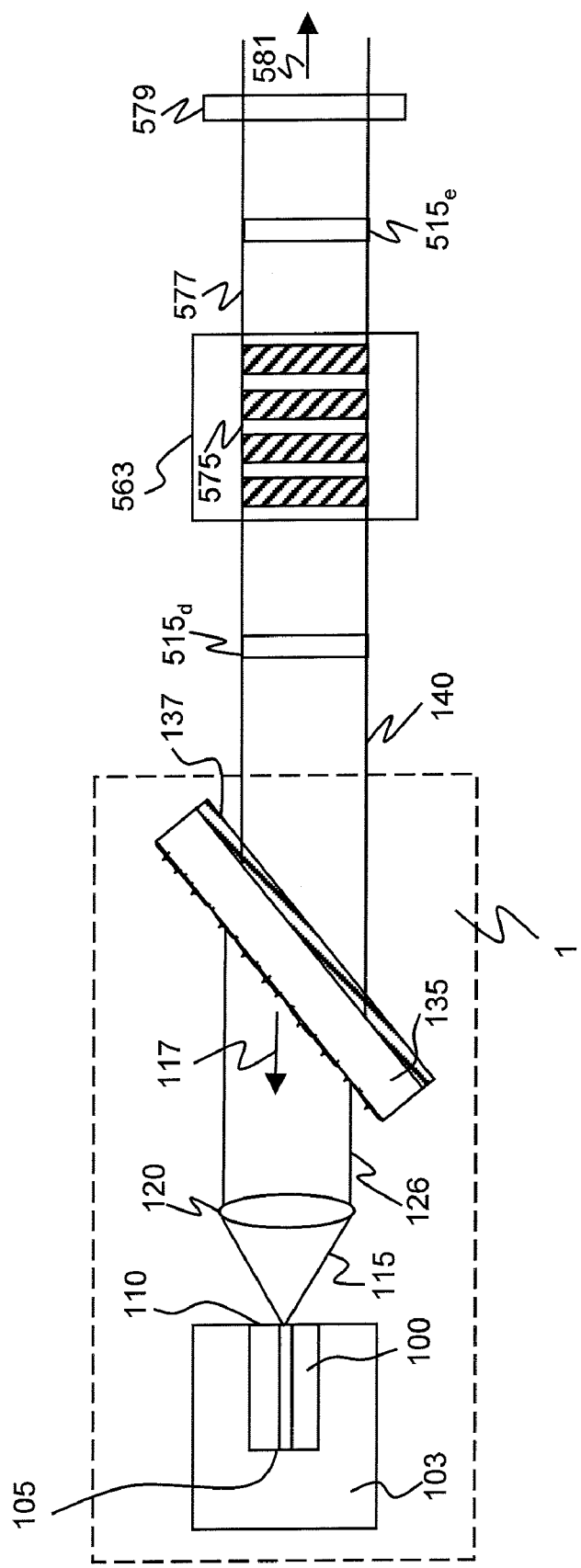
FIG. 8 is a diagram of a frequency-double laser apparatus incorporating a multi-mode nonlinear waveguide according to the present invention.

With reference to FIG. 8, the nonlinear waveguide 575 may also be a multimode waveguide which is tens of micrometers wide as compared to the typical 3 μm width for the single mode waveguide 565 in FIG. 7. Because of the high input power of the incident beam 140 received from the Littrow-stabilized laser diode 1, the conversion efficiency of the broader waveguide 575 can still be very high, even though the optical pump power is less confined than the single mode waveguide case. The beam 140 emitted from the laser diode 1 is focused in only one of two orthogonal directions by an additional cylinder lens 515*d* onto the entrance of the multimode nonlinear waveguide 575. An advantage of the configuration is that the optical power density within the waveguide 575 is lower than in the single mode waveguide 565 of FIG. 8, and therefore there is less chance of photorefractive damage. Further, because of the width of the beam 140, the beam will remain collimated in wide direction such that very little wave guiding effect by the waveguide 575 will be necessary in that direction. Again, the waveguide 575 ran be a regularly segmented, periodically poled waveguide for efficient second harmonic generation. The output 577 from the waveguide 575 is allowed to re-expand in the narrow direction then collimated by another cylinder lens element 515*e*. A dichroic filter 579 can be used to block any remaining unconverted red or near-infrared light and to pass only the frequency doubled ultraviolet, blue or green light beam 581 generated in the nonlinear waveguide 575.

Other embodiments of present invention can employ multi-pass second harmonic generation or frequency doubling configuration, wherein additional optical means are employed to re-direct a portion of the fundamental optical beam 140 transmitted through the nonlinear element 155 back into the nonlinear optical element 155. Examples of multi-pass frequency-doubling configurations include double-pass, triple-pass and n-pass configurations employing retro reflectors; and configurations when nonlinear elements are positioned inside ring resonators or Fabry-Perot type resonators: several of these configurations are described in the US patent No. RE35,215, in the names of Waarts et al. incorporated herein by reference.

Figure 9:
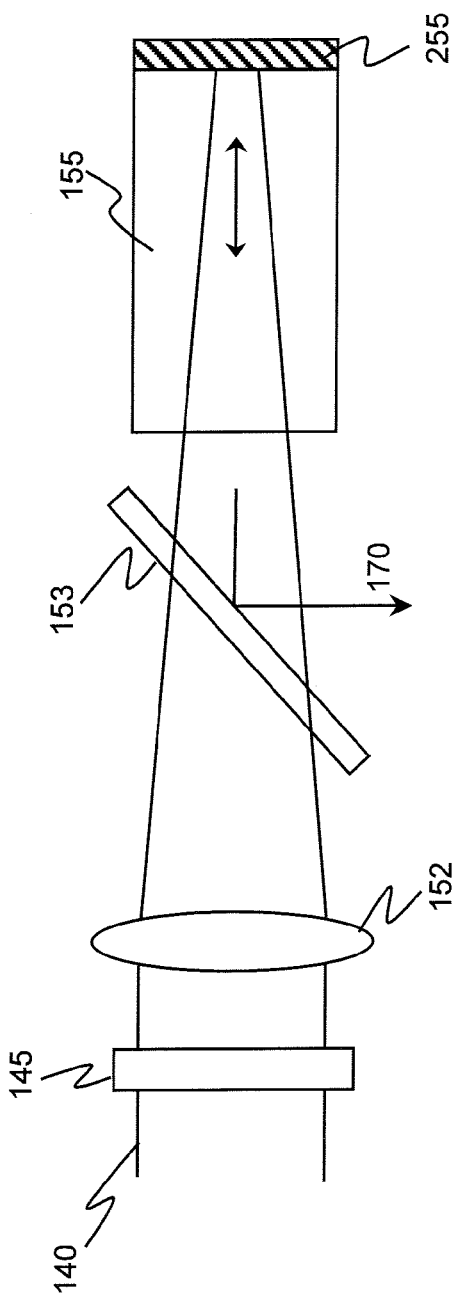
FIG. 9 is a schematic diagram of an exemplary multi-path configuration of the nonlinear element

In FIG. 9 a double-pass frequency-doubling configuration is shown in accordance with the present invention. The high-power beam 140 emitted by the Littrow-stabilized laser diode 1 in accordance with the present invention is collimated and focused by a lens system 152 into a nonlinear crystal 155. The nonlinear crystal 155 has a reflective coating 255 integrated on a surface which is opposite from the input side that receives the high-power beam 140. The coating 255 reflects at least a substantial portion of the beam 140 as well as the frequency doubled light generated by the nonlinear crystal material 155. A beamsplitter 153 which is transmissive for light having the fundamental frequency but reflective of the frequency doubled light 170 is positioned in the return path of the light beam between the lens system 152 and the nonlinear crystal 155 in order to couple the frequency doubled blue light 170 out of the laser system. The retro reflector 255 should be slightly misaligned from the laser beam so that the light reflected back toward the laser is misaligned from the laser output facet. Care should be taken that the phase of the reflection from the mirror 255 is the same for the fundamental and the second harmonic generated beam to prevent phase mismatch and reduced output efficiency.

In the preferred configuration, the laser diode chip 100 is a GaAs/InGaAs semiconductor heterostructure chip of type employed in commercial high-power 980 nm lasers commonly used for optical pumping of erbium-doped fiber amplifiers (EDFA). These chips are commercially available and inexpensive. A laser diode chip of this type has a high-reflectivity back facet and a front facet with reflectivity of about several percent. These laser chips, when coupled to a fiber Bragg grating (FBG) which retro-reflects a small portion of the diode radiation back into the laser diode to provide an optimal output reflectivity of ~3%, are cable of producing in excess of 1 W of stabilized laser radiation at a fundamental wavelength of 980 nm, with a linewidth of approximately 0.3–1 nm. However, for efficient nonlinear frequency conversion, a laser linewidth of 0.02–0.1 nm or less is required. By using a laser diode chip of this type in the Littrow-stabilized configuration shown in FIGS. 2 and 6 with an anti-reflection coated front facet, it is possible to generate laser radiation at the fundamental frequency corresponding to the fundamental wavelength of 980 nm with the linewidth less than 0.1 nm, as is required for efficient frequency doubling in the nonlinear element. To ensure high lasing efficiency and kink-free operation, the transmission grating has to retro-reflect back into the laser chip the optimal portion of the diode radiation, 1–5% typically.

Therefore in the preferred embodiment of this invention the $1^{st}$ order diffraction efficiency of the transmission grating 135 at the fundamental wavelength should be optimized so to provide the optimal level of optical feedback into the laser diode, typically 1–10%, accounting for additional optical losses of the retro reflected beam. This can be achieved by optimizing the shape and depth of the grating pitch.

In other embodiments of the present invention, the laser diode chip 100 can be a semiconductor laser chip of any known type capable of generating optical power in excess of 0.1–1 W in a single spatial mode. Semiconductor laser chips incorporating GaN, InP, and GaAs based heterostructures can produce radiation with wavelength from 350 nm over 1600 nm. Frequency doubling of its light in accordance with the present invention will yield laser radiation with wavelength in the interval from 175 nm to over 800 nm, with the short-wavelength part of this spectral interval corresponding to UV, blue and green light being of the most practical interest for frequency doubling approach.

Efficiency of the SHG in the nonlinear element can vary during the lifetime of the laser device due to misalignment of the fundamental wavelength of the laser diode radiation and a spectral band of efficient frequency doubling, which can be caused by changing environmental conditions and aging. Hence, it may be useful to provide means for controlling and stabilization of the frequency-doubled output during operation of the device. These means include means for exploiting sensitivity of the wavelength position of the spectral band of efficient SHG to temperature of the nonlinear element, and means for controlling the fundamental wavelength of the Littrow-stabilized extended cavity.

Figure 10:
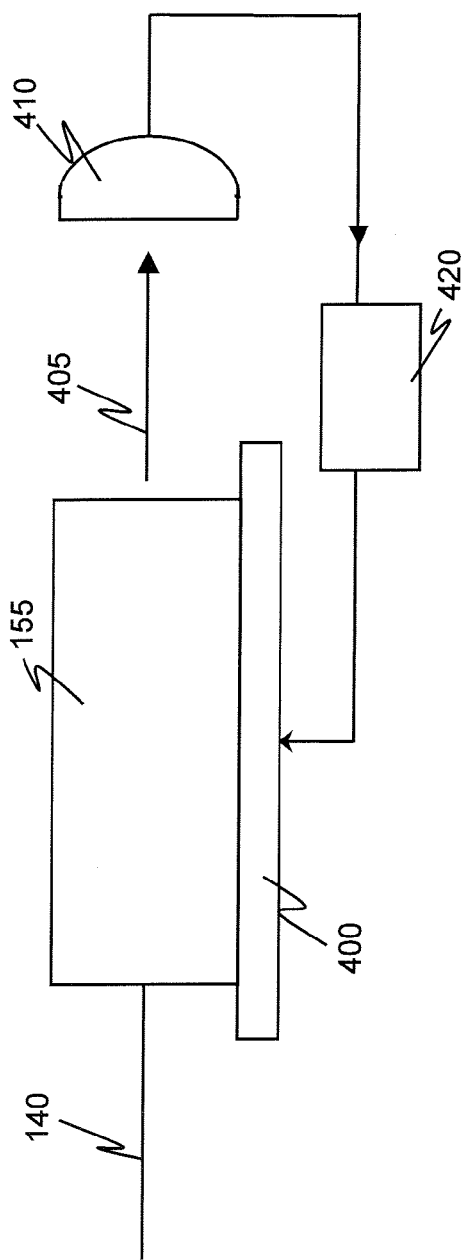
FIG. 10 is a diagram of temperature control feedback circuitry for frequency-doubled output stabilization.

With reference to FIG. 10, one embodiment of present invention includes an electrical heating or heating and cooling element 400 thermally connected to the nonlinear element 155, an optical detector 410 positioned to receive a portion of the frequency doubled output 405, and an electronic control device 420 capable of controlling the electrical heating or heating and cooling element 400. During operation of the laser device, the optical detector 410 generates an electrical signal S varying as a function of the received frequency doubled output. The electrical signal S is than passed onto the electronic control device 420, which controls the heating element 400 in such a way to counteract variation of the electrical signal S in time, thereby stabilizing the frequency-double optical output.

In another embodiment of the present invention, the electronic control device 400 is used to control angular position of the transmission grating 135 by controlling the piezo-electric actuator 193, thereby controlling the fundamental wavelength of the laser diode radiation to counteract variation of the electrical signal S in time, thereby stabilizing the frequency-double optical output.

What is claimed is:

1. A laser apparatus, comprising:
   a laser diode having a reflective back facet and a front facet having a reflectance of less than 1% for emitting an optical beam at a fundamental frequency along an optical path;
   a collimating means for at least partially collimating the optical beam into an at least partially collimated beam along the optical path;
   a bulk transmission grating disposed in the optical path for receiving the at least partially collimated beam and for returning a portion of the at least partially collimated beam back toward the laser diode by means of diffraction, said portion being less than 10% in power so as to provide optical feedback into the laser diode between 1% and 5%, wherein the laser diode reflective back facet and the bulk transmission grating form an extended laser cavity, and wherein in operation, at least a substantial portion of the at least partially collimated beam is transmitted through the bulk transmission grating for producing a laser output beam propagating along the optical path.

2. The laser apparatus as defined in claim 1, further comprising means for rotating the bulk transmission grating for tuning of the fundamental laser frequency.

3. The laser apparatus as defined in claim 1, wherein the extended cavity is an extended cavity in a Littrow configuration formed by the bulk transmission grating.

4. The laser apparatus as defined in claim 3 further comprising a frequency-doubling nonlinear element positioned outside of the extended cavity to receive the laser output beam for producing a frequency-doubled output beam.

5. The laser apparatus as defined in claim 4, wherein the laser diode is a high-power laser diode for emitting light in a range of wavelengths between 350 nm and 1600 nm.

6. The laser apparatus defined in claim 5, wherein the frequency-doubling nonlinear element is for producing light output having wavelength in the range 175 nm–800 nm.

7. The laser apparatus defined in claim 4, wherein the bulk transmission grating is oriented so as to align the fundamental laser frequency within the spectral band for frequency doubling of the nonlinear element.

8. The laser apparatus defined in claim 4, wherein the nonlinear element is a periodically poled crystal.

9. The laser apparatus defined in claim 8, wherein the nonlinear element is a periodically poled $LiNbO_3$ crystal.

10. The laser apparatus defined in claim 4, wherein the nonlinear element is one of: a nonlinear waveguide, a single mode nonlinear waveguide, and a periodically poled nonlinear waveguide.

11. The laser apparatus defined in claim 4, further comprising optical means for passing the laser beam through the nonlinear element multiple times.

12. The laser apparatus defined in claim 1, wherein the bulk transmission grating is a surface-relief diffraction grating.

13. The laser apparatus defined in claim 1, wherein the bulk transmission grating is a holographic diffraction grating.

14. The laser apparatus defined in claim 1, wherein the bulk transmission grating is made of optically transparent material with an anti-reflection coating on at least one side of the grating.

15. The laser apparatus as defined in claim 5 further comprising an optical isolator disposed between the bulk transmission grating and the nonlinear element and optically aligned with said grating and said nonlinear element for preventing back reflections into the extended laser cavity.

16. The laser apparatus as defined in claim 5, wherein the nonlinear element and/or at least one of coupling means associated with the nonlinear element for optical coupling of the laser output beam and the frequency-doubled beam into and out of the nonlinear element are configured for preventing back reflections into the extended laser cavity.

17. The laser apparatus as defined in claim 1, further comprising a polarization controller disposed between the laser diode and the bulk transmission grating and optically aligned with said grating and said laser diode for aligning a polarization direction of the optical beam with a polarization direction providing maximum diffraction of said beam by the bulk transmission grating.

18. The laser apparatus as defined in claim 1, wherein the laser diode is oriented so to align a polarization direction of the optical beam with a polarization direction providing maximum diffraction of said beam by the bulk transmission grating.

19. The laser apparatus as defined in claim 1, further comprising an anamorphic lens or an anamorphic combination of lenses disposed to receive light from the anti-reflection coated facet of the laser diode for reshaping the optical beam into a beam having substantially circular symmetry in a plain perpendicular to its optical axes for propagating along the optical path.

20. The laser apparatus as defined in claim 4, wherein the laser diode in operation has a substantially single-frequency optical spectrum.

21. The laser apparatus as defined in claim 4, wherein the laser diode, when in operation, has a substantially multi-frequency optical spectrum.

22. The laser apparatus as defined in claim 21, wherein in operation an electrical dither current is superimposed on an injection current of the laser diode for stabilizing of a time-averaged power of the frequency-doubled output beam.

23. The laser apparatus as defined in claim 5, further comprising control means for controlling optical power of the frequency-doubled output beam at a substantially constant level.

24. The laser apparatus as defined in claim 23, wherein said control means are electrical and optical control means comprising:
   an optical detector for measuring optical power of the frequency-doubled output beam;

a heating element for changing temperature of the nonlinear element; and, an electrical feedback circuit electrically coupling the heating element with the optical detector.

25. The laser apparatus as defined in claim 23, wherein said control means are electrical and optical control means comprising:

an optical detector for measuring optical power of the frequency-doubled output beam;

a means for rotating the bulk transmission grating for tuning of the fundamental laser frequency; and, an electrical feedback circuit electrically connecting the optical detector with the means for rotating the bulk transmission grating.

26. The laser apparatus as defined in claim 5, wherein the laser diode is a 980 nm high-power laser diode, and wherein the frequency-doubling nonlinear element is for producing blue light.

* * * * *